(12) United States Patent
Nakamura

(10) Patent No.: US 6,806,538 B2
(45) Date of Patent: Oct. 19, 2004

(54) SOI SEMICONDUCTOR DEVICE

(75) Inventor: Toshiyuki Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/133,350

(22) Filed: Apr. 29, 2002

(65) Prior Publication Data

US 2002/0119627 A1 Aug. 29, 2002

Related U.S. Application Data

(62) Division of application No. 09/628,291, filed on Jul. 28, 2000, now Pat. No. 6,391,692.

(30) Foreign Application Priority Data

Mar. 2, 2000 (JP) .......................................... 2000-057088

(51) Int. Cl.[7] .............................................. H01L 27/01
(52) U.S. Cl. ........................ 257/349; 257/347; 438/455; 438/459
(58) Field of Search ................................ 257/288, 296, 257/347, 349; 438/300, 585, 455, 459

(56) References Cited

U.S. PATENT DOCUMENTS

| | | | |
|---|---|---|---|
| 5,543,338 A | * | 8/1996 | Shimoji ...................... 438/151 |
| 5,818,085 A | * | 10/1998 | Hsu et al. .................... 257/347 |
| 5,946,585 A | * | 8/1999 | Zhang et al. ................ 438/475 |
| 6,060,743 A | * | 5/2000 | Sugiyama et al. .......... 257/321 |
| 6,184,556 B1 | * | 2/2001 | Yamazaki et al. .......... 257/354 |
| 6,187,605 B1 | * | 2/2001 | Takasu et al. ................ 438/29 |
| 6,287,900 B1 | * | 9/2001 | Yamazaki et al. .......... 438/151 |
| 6,323,522 B1 | * | 11/2001 | Hargrove et al. ........... 257/347 |
| 6,346,717 B1 | * | 2/2002 | Kawata ......................... 257/72 |
| 6,353,251 B1 | * | 3/2002 | Kimura ....................... 257/473 |
| 6,365,941 B1 | * | 4/2002 | Rhee ........................... 257/357 |
| 6,417,565 B1 | * | 7/2002 | Komatsu ..................... 257/750 |
| 6,537,922 B1 | * | 3/2003 | Ko et al. ..................... 438/723 |

* cited by examiner

*Primary Examiner*—John F. Niebling
*Assistant Examiner*—Jennifer M. Kennedy
(74) *Attorney, Agent, or Firm*—Venable LLP; Michael A. Sartori; Daniel G. Vivarelli, Jr.

(57) ABSTRACT

The present invention aims to provide a field effect transistor which inhibits an aggregation of silicon atoms attendant on heat treatment and has stable source/drain shapes. The field effect transistor according to the present invention is manufactured using a substrate on which a silicon layer, an buried oxide film (BOX film) and an SOI layer are stacked in order. The field effect transistor has an element isolation layer formed in the SOI layer and further includes visored portions provided so as to cover angular portions on the main surface side of an activation layer defined by the element isolation layer.

16 Claims, 4 Drawing Sheets

SOI SEMICONDUCTOR DEVICE

This application is a divisional of Ser. No. 09/628,291, filed Jul. 28, 2000, now U.S. Pat. No. 6,391,692.

BACKGROUND OF THE INVENTION

Field of the Invention

The present invention relates to a field effect transistor (FET: Field Effect Transistor) formed over an SOI (Silicon On Insulator) substrate, and particularly to a field effect transistor having an elevated source/drain structure, which is manufactured by selectively epitaxial growth on a source/drain region alone after the formation of the source/drain region, and a method of manufacturing the same.

Description of the Related Art

The formation of a field effect transistor over an SOI substrate as an alternative to a conventional bulk semiconductor substrate has been performed in recent years. The SOI-FET has the merit that it is structurally small in parasitic capacity, latchup-free, low in soft error rate, and relatively easy in element isolation, for example. Therefore, great attention has recently been focused on the possibility of application to a high-speed and low power consumption LSI. A fully depletion type SOI-FET has an advantage in that since a depletion layer formed below a gate electrode reaches an buried oxide film below an SOI layer, the depletion layer becomes small in capacitance and a subthreshold coefficient is reduced to a substantially ideal value.

The implementation of a complete depletion type SOI-FET having a micro gate length needs to increase the concentration of an impurity in a channel region, restrain the extension of a depletion layer from a source/drain region, and control a short channel effect by an increase in charge share coefficient. On the other hand, since the expansion of the depletion layer below a gate electrode becomes narrow as the concentration of the impurity in the channel increases, it is necessary to thin the thickness of an SOI layer for the purpose of performing a fully depletion type operation (allowing the depletion layer to reach an buried oxide film). When the gate length is less than or equal to 0.2 $\mu$m, the thickness of the SOI layer must be thinned to a thickness of from 20 nm to 50 nm. Therefore, a source/drain resistance increases and hence a transistor characteristic is degraded.

As a method of reducing the source/drain resistance, for example, a salicide process for selectively forming a silicide layer comprised of titanium (Ti) and/or cobalt (Co) in a source/drain region has been used. However, when the thickness of the SOI layer becomes thinner than 50 nm, it is known that it becomes difficult to form the silicide layer. When the silicide layer is formed so as to reach the buried oxide film, an aggregation is apt to occur, thus causing the possibility that an increase in resistance and fractures in channel and source/drain regions will occur. A problem arises in that when silicidation is made with the SOI layer left behind, the resistance of the silicide layer is not sufficiently lowered or no silicide layer is formed over a thin-line portion. From the viewpoint of such a background, a method of selectively epitaxially-growing a silicon layer over a source/drain region preceding the execution of the salicide process, thickening the silicon layer in the source/drain region and thereafter forming a silicide layer is now adopted.

However, the process of selectively epitaxially-growing the silicon layer thereon needed to perform heat treatment at a high temperature of at least 930° C. or higher in a hydrogen atmosphere for the purpose of removing a native oxide film over the surface of an SOI layer. A problem has been confirmed in that when a temperature profile in such a selective epitaxial-growth process is used, atoms of silicon begin to aggregate from an end of an SOI layer pattern during high-temperature heat treatment. As a result, there is a possibility that the shape of the source/drain region in the SOI layer will break down, thus making it impossible to implement the SOI-FET.

SUMMARY OF THE INVENTION

With the foregoing in view, it is therefore an object of the present invention to provide a field effect transistor which controls an aggregation of silicon atoms incident to heat treatment and has a stable source/drain shape.

In order to achieve the above object, there is provided a field effect transistor according to the present invention, comprising a first semiconductor substrate, a first insulating layer formed over the first semiconductor substrate, a second semiconductor substrate formed over the first insulating layer, an element isolation layer formed in the second semiconductor substrate, and a second insulating layer formed so as to cover each of angular portions on the main surface side of an activation layer defined by the element isolation layer.

Further, there is provided a method of manufacturing a field effect transistor, according to the present invention, which comprises preparing a substrate on which a first semiconductor layer, a first insulating layer and a second semiconductor layer are stacked in order, forming an element isolation layer within the second semiconductor layer, forming a gate electrode over the substrate with a gate insulating film interposed therebetween, forming a second insulating layer so as to cover angular portions on the main surface side of an activation layer defined by the element isolation layer, and forming a third semiconductor layer by a selective epitaxial growth method with the gate electrode and the second insulating film as masks.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 2:
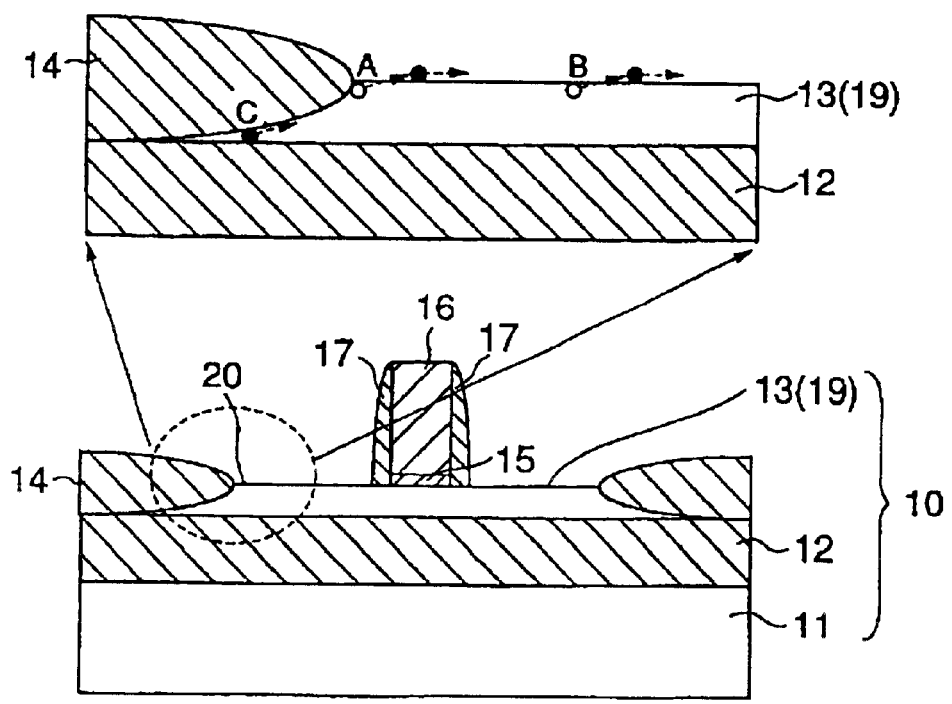
FIG. 2 is an explanatory view illustrating the manner of an aggregation of an SOI layer.

First embodiment:

FIG. 2 is an explanatory view showing the manner of an aggregation of an SOI layer. An SOI substrate 10 is a board or substrate formed by stacking an buried oxide film (BOX oxide film) 12 and an SOI layer 13 over a silicon layer 11 in order. A field oxide film 14 for device or element isolation is formed within the SOI layer 13. Further, an activation layer 19 is defined by the field oxide film 14. Each of angular portions 20 is formed on the main surface side of the activation layer 19 at an interface between the field oxide film 14 and the activation layer 19. The angular portion 20 is engaged in the field oxide film in its transverse direction, which is one developed by a so-called bird's beak. A gate oxide film 15, a gate electrode 16 and side walls 17 each comprised of a silicon oxide film are formed over the SOI substrate 10 in accordance with the MOSFET forming process known to date. Thereafter, an unillustrated silicon layer is formed over the SOI layer 13 for forming a source/drain region by a selective epitaxial growth method.

In a process for forming the silicon layer by the selective epitaxial growth method, the SOI layer 13 begins to aggregate due to hear treatment at greater than or equal to a predetermined temperature. The aggregation thereof will be explained using an enlarged view lying within a circle indicated by a dotted line in FIG. 2. The aggregation of the SOI layer 13 is generally considered to start from the occurrence of a migration of atoms of silicon at a position designated at A (angular portion 20). Since an angulated portion (corresponding to the position designated at B) of the silicon crystal, needs much energy to keep a crystallized state, the migration of the silicon atoms is apt to occur. Since each atom of silicon at a position designated at C is covered with the field oxide film 14, it is hard to migrate as compared with the silicon atoms at the positions designated at A and B.

It can be understood from the above description that the atoms of silicon start to migrate in the order of the position designated at A, the position designated at B and the position designated at C upon heat treatment at a given temperature. In other words, each atom of silicon at the position designated at C is most hard to migrate with respect to heat treatment at a higher temperature.

Figure 6:
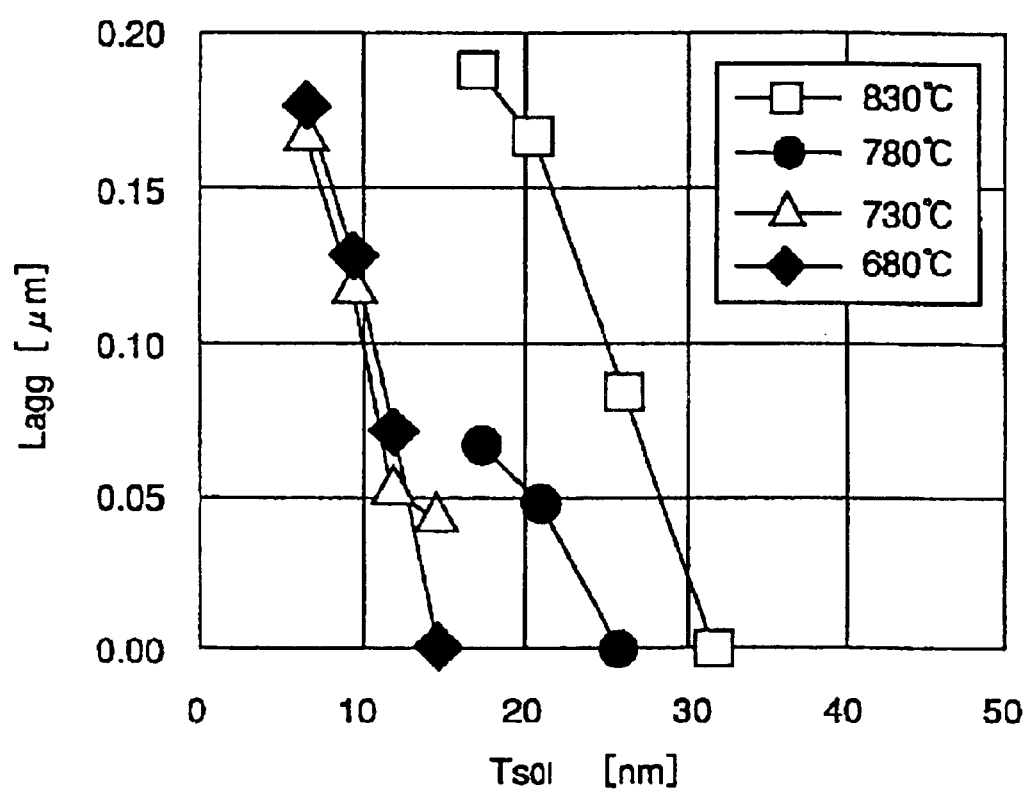
FIG. 6 is an explanatory view depicting the relationship between temperature and aggregation of an SOI layer.

FIG. 6 is an explanatory view showing the relationship between temperature and an aggregation of an SOI layer. The vertical axis (Lagg) indicates distances (agglomeration) at which aggregations proceed from the boundary of the SOI layer 13 and the field oxide film 14 due to heat treatment at various temperatures upon the formation of the silicon layer by the selective epitaxial growth method. The horizontal axis (TSOI) indicates the thickness of the SOI layer 13. Graphs at the respective heat-treatment temperatures respectively indicate critical thicknesses of the SOI layer 13. It is easily understood that with upcoming increasingly thinning of the thickness of the SOI layer 13, the heat treatment at the formation of the silicon layer by the selective epitaxial growth method is required to be done at lower temperatures.

Figure 1:
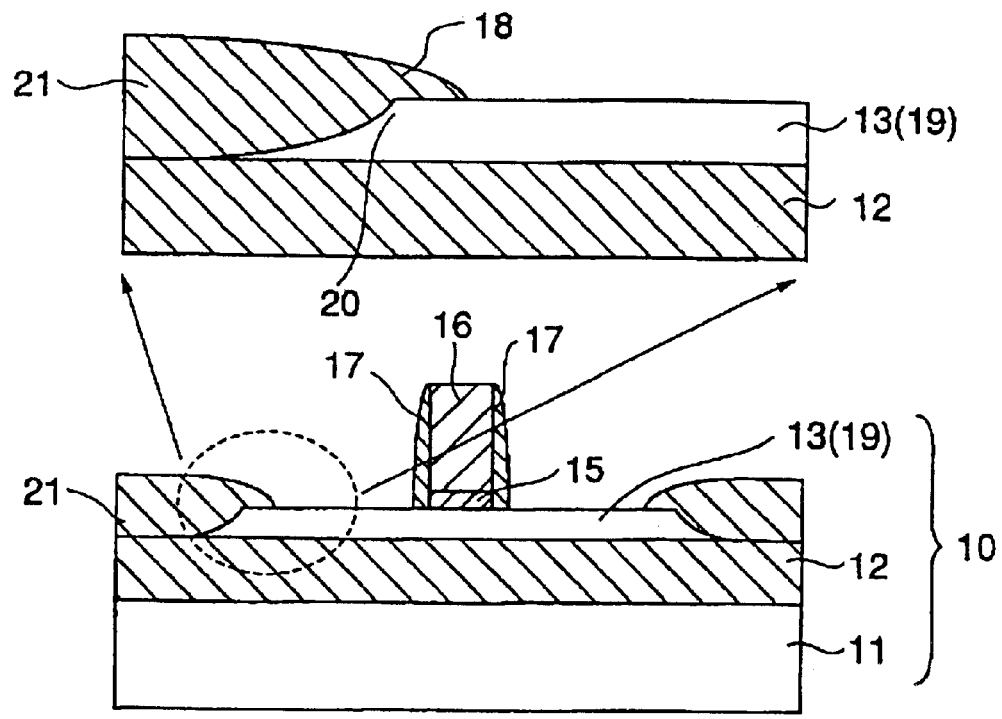
FIG. 1 is a cross-sectional view showing a first embodiment of the present invention.

FIG. 1 is a cross-sectional view showing a first embodiment of the present invention. Elements of structure that are common to those shown in FIG. 2, are identified by the same reference numerals and the description thereof will therefore be omitted. An element separation or isolation layer 21 has a visored portion 18 for covering each of angular portions 20 on the main surface side of an activation layer 19. The element isolation layer 21 having the visored portion 18 needs to be comprised of such a material as not to change the shape thereof at a temperature at which each atom of silicon begins to aggregate. While the present embodiment has described the example using the silicon oxide film, a silicon nitride film or the like may be used. As a result, since the position designated at A (angular portion 20) becomes the same state as the position designated at C, the migration of each atom of silicon becomes hard to occur with respect to high-temperature heat treatment in the subsequent process.

Figure 3:
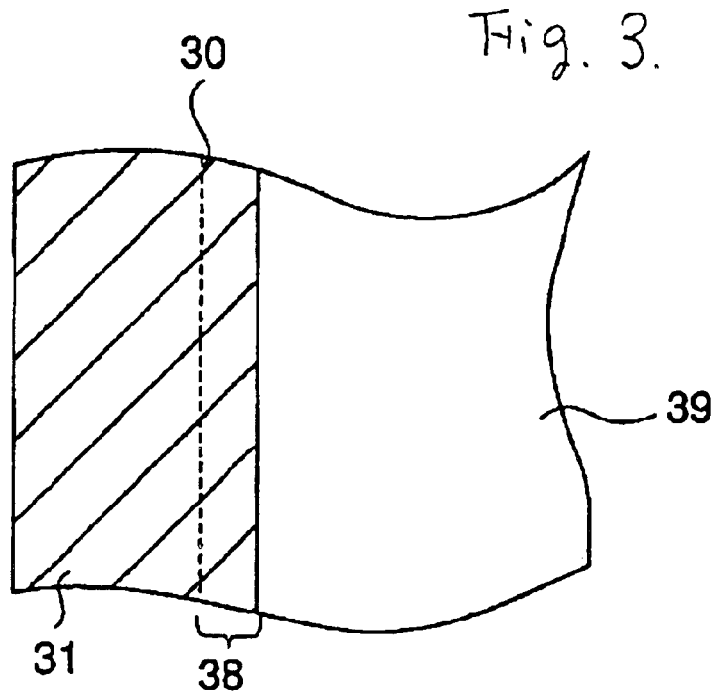
FIG. 3 is a plan view depicting the first embodiment of the present invention.

FIG. 3 is a plan view showing the first embodiment of the present invention. In particular, the drawing is a plan view of an enlarged portion lying within a circle indicated by a dotted line in FIG. 1. As viewed on a plane basis, the migration is most easy to occur at an end 30 on the main surface side of an activation region 39, which is defined by each element isolation region 31. Thus, the end 30 on the main surface side of the activation region 39 needs to be covered with a visored portion 38 included in the element isolation region 31 as the first embodiment of the present invention is seen on the plane basis.

According to the first embodiment of the present invention, since the element isolation layer (region) having the visored portion for covering each angular portion (end) on the main surface side of the activation region is adopted, the aggregation of the SOI layer can be inhibited. As a result, the formation of the silicon layer by the selective epitaxial growth method can be executed with stability.

Figure 4:
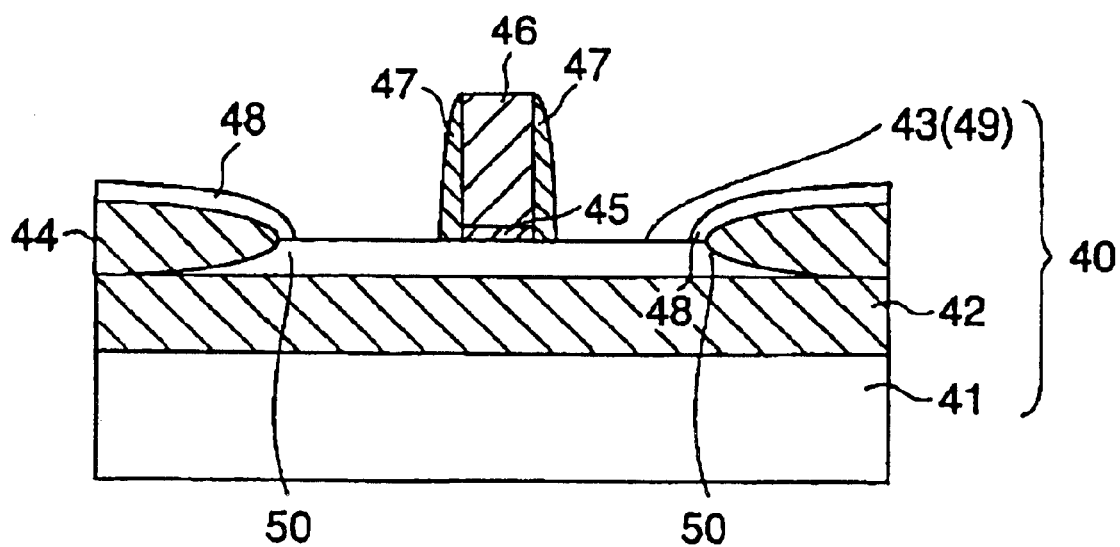
FIG. 4 is a cross-sectional view showing a second embodiment of the present invention.

Second Embodiment:

FIG. 4 is an explanatory view showing a second embodiment of the present invention. An SOI substrate 40 is a substrate formed by stacking an buried oxide film (BOX oxide film) 42 and an SOI layer 43 over a silicon layer 41 in order. A field oxide film 44 for device or element isolation is formed in the SOI layer 43. Further, an activation layer 49 is defined by the field oxide film 44. Each of angular portions 50 is formed on the main surface side of the activation layer 49 at an interface between the field oxide film 44 and the activation layer 49. A gate oxide film 45, a gate electrode 46 and side walls 47 each comprised of a silicon oxide film are formed over the SOI substrate 40 in accordance with the known MOSFET forming process.

The present embodiment is characterized in that each of the angular portions 50 is covered with an insulating film 48. The insulating film 48 needs to be composed of such a material as not to vary the shape thereof at a temperature at which the atoms of silicon begin to aggregate. A silicon oxide film or a silicon nitride film may preferably be used for the insulating film 48. As a result, the position (angular portion 50) designated at A in FIG. 2 is kept in the same state as the position designated at C. Therefore, the migration of each atom of silicon is hard to occur with respect to high-temperature heat treatment in the subsequent process.

Figure 5:
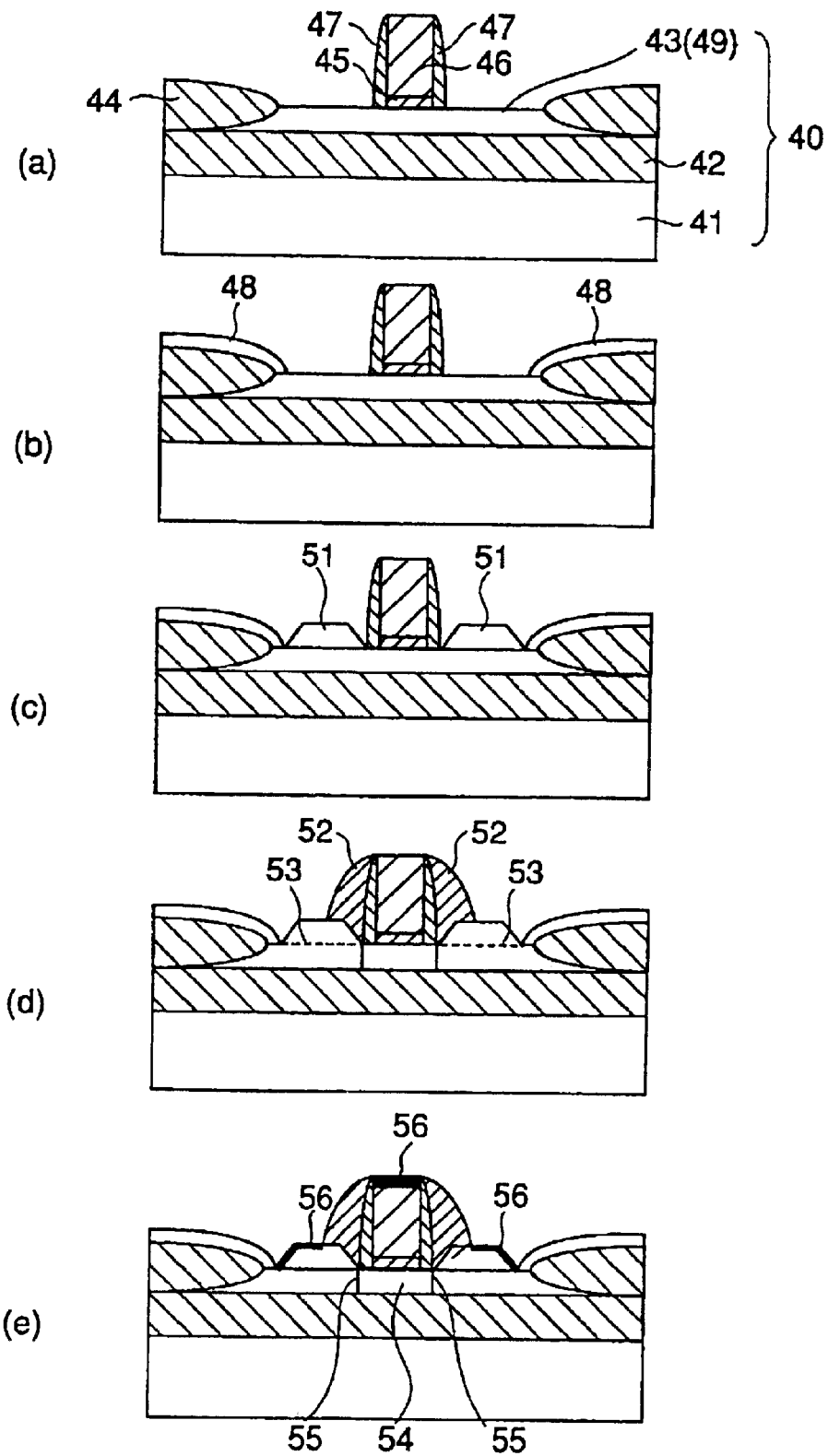
FIG. 5 is a process view illustrating a method of manufacturing the second embodiment of the present invention.

A method of manufacturing the present embodiment will next be described. FIG. 5 is a process view showing a method of manufacturing the second embodiment of the present invention. SOI-NMOSFET will be explained herein as an example.

An SOI substrate 40 obtained by stacking a silicon layer 41, a BOX film 42 and an SOI layer 43 on one another in order, is used as a substrate. While the thickness of the SOI layer 43 varies according to the final structure of MOSFET, it is adjusted so as to finally become 20 nm in the present embodiment. Next, a field oxide film 44 is formed over the SOI layer 43 and an activation layer 49 is defined by the field oxide film 44. Further, a gate oxide film 45, a gate electrode 46 and side walls 47 are formed. The side walls 47 are formed by depositing a silicon oxide film having a thickness of 10 nm and thereafter subjecting it to etchback (see FIG. 5(a)).

Angular portions 50 are developed on the main surface side of the activation layer 49 at an interface between the field oxide film 44 and the activation layer 49. An insulating film 48 is formed so as to cover each angular portion 50. For example, a silicon oxide film having a thickness of about 10 nm is deposited by CVD and subjected to patterning by photolithography technology. The manner in which the silicon oxide film 48 covers the activation layer 49 by about 5 nm as viewed from the end of the field oxide film 44 is illustrated herein (see FIG. 5(b)).

Next, a silicon film 51 having a thickness of from about 50 nm to about 100 nm is formed over a source/drain formation predetermined region of the SOI layer 43 by a selective epitaxial growth method. This structure is called a "so-called elevated source/drain structure" (see FIG. 5(c)).

Next, side walls 52 thicker than the side walls 47 in thickness are formed outside the side walls 47. Then arsenic (As) is implanted to form a source and drain or source/drain 53. The thickness of each side wall 52 is suitably set in such a manner that when an impurity to be introduced upon source/drain implantation corresponding to the subsequent process is diffused in the transverse direction by heat treatment, a junction between each of the source and drain and a channel region appears in the vicinity of each edge of the gate electrode. The thickness of the side wall 52 in the present embodiment is about 800 Å (see FIG. 5(d)).

Thereafter, RTA (Rapid Thermal Annealing) is performed. As a result, the source and drain 53 are activated so that the junction 55 between each of the source/drain 53 and the channel region 54 reaches the neighborhood of each edge of the gate electrode. Next, cobalt (Co) or titanium (Ti) is deposited and RTA is carried out to thereby form a silicide layer 56 over each of the gate electrode 46 and the source/drain 53. At this time, a nitride formed over the surface thereof is removed by etching through the use of ammonia hydrogen peroxide ($NH_4OH/H_2O_2$) or the like. RTA is carried out again to thereby achieve a reduction in the resistance of the silicide layer 56 (see FIG. 5(e)).

According to the second embodiment of the present invention, since the insulating film for covering each angular portion provided on the main surface side of the activation layer is formed, the aggregation of the SOI layer can be inhibited. As a result, the silicon layer can be stably formed by the selective epitaxial growth method.

According to the present invention as described above in detail, since the shape of the element isolation layer is contrived or the structure for covering each angular portion on the main surface side of the activation layer with the insulating film is adopted, a field effect transistor can be provided which controls or inhibits the aggregation of the atoms of silicon incident to heat treatment and has stable source/drain shapes.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A field effect transistor, comprising:
   a first semiconductor layer;
   a first insulating layer formed over said first semiconductor layer;
   a second semiconductor layer formed over said first insulating layer;
   an element isolation layer formed in said second semiconductor layer; and
   a second insulating layer formed on the element isolation layer and only a peripheral region of the second semiconductor layer so that the second insulating layer formed on the peripheral region of the second semiconductor layer restrains a migration of silicon atoms in the peripheral region of the semiconductor layer.

2. The field effect transistor as claimed in claim 1, wherein said element isolation layer and said second insulating layer are respectively comprised of the same material.

3. The field effect transistor as claimed in claim 1, wherein said element isolation layer and said second insulating layer are respectively comprised of a silicon oxide film.

4. The field effect transistor as claimed in claim 1, wherein said element isolation layer is comprised of an oxide film and said second insulating layer is comprised of a nitride film.

5. The field effect transistor as claimed in claim 1, wherein the element isolation layer is contacted with the first insulating layer so that the second semiconductor layer is completely isolated by the element isolation layer and the first insulating layer.

6. A field effect transistor, comprising:
   a first semiconductor layer;
   a first insulating film formed over said first semiconductor layer;
   a second semiconductor layer formed over said first insulating film;
   an element isolation region formed within said second semiconductor layer; and
   a second insulating film formed on the element isolation region and only a peripheral region of the second semiconductor layer so that the second insulating layer formed on the peripheral region of the second semiconductor layer restrains a migration of silicon atoms in the peripheral region of the semiconductor layer.

7. The field effect transistor as claimed in claim 6, wherein said element isolation region and said second insulating film are respectively comprised of the same material.

8. The field effect transistor as claimed in claim 6, wherein said element isolation region and said second insulating film are respectively comprised of a silicon oxide film.

9. The field effect transistor as claimed in claim 6, wherein said element isolation region is comprised of an oxide film and said second insulating film is comprised of a nitride film.

10. The field effect transistor as claimed in claim 6, wherein the element isolation region is contacted with the first insulating film so that the second semiconductor layer is completely isolated by the element isolation region and the first insulating film.

11. A semiconductor device comprising:
    a semiconductor substrate;
    a first insulating film formed on the entire surface of the semiconductor substrate;
    a silicon on insulator (SOI) layer containing silicon formed on the first insulating layer;
    an isolation layer formed on the first insulating layer so that the SOI layer is isolated by the isolation layer;
    a second insulating layer formed on the isolation layer and only on a peripheral region of the SOI layer so as to restrain a silicon migration at the peripheral region of the SOI layer; and
    a semiconductor element formed on the SOI layer.

12. A semiconductor device according to claim 11, wherein the isolation layer and the second insulating layer are substantially formed of the same material.

13. A semiconductor device according to claim 11, wherein the isolation layer and the second insulating layer are formed of a silicon oxide.

14. A semiconductor device according to claim 11, wherein the isolation layer is formed of a silicon oxide and the second insulating layer is formed of a silicon nitride.

15. A semiconductor device according to claim 11, wherein the semiconductor element is a field effect transistor.

16. A semiconductor device according to claim 15, wherein the semiconductor element includes a source region and a drain region both of which are formed on the SOI layer, a gate insulating layer formed on the SOI layer and a gate electrode formed on the gate insulating layer.

* * * * *